United States Patent
Woodard

(10) Patent No.: US 6,368,470 B1
(45) Date of Patent: Apr. 9, 2002

(54) HYDROGENATING A LAYER OF AN ANTIREFLECTION COATING

(75) Inventor: Floyd E. Woodard, San Jose, CA (US)

(73) Assignee: Southwall Technologies, Inc., Palo Alto, CA (US)

(*) Notice: Subject to any disclaimer, the term of this patent is extended or adjusted under 35 U.S.C. 154(b) by 0 days.

(21) Appl. No.: 09/474,457

(22) Filed: Dec. 29, 1999

(51) Int. Cl.[7] .............................................. C23C 14/34
(52) U.S. Cl. .......................... 204/192.27; 204/192.23; 204/192.15; 204/192.12; 427/419.3; 427/164
(58) Field of Search .................... 204/192.12, 192.15, 204/192.23, 192.27; 427/419.3, 164

(56) References Cited

U.S. PATENT DOCUMENTS

| | | | |
|---|---|---|---|
| 4,010,291 A | 3/1977 | Katsube et al. | 427/126 |
| 4,400,254 A | 8/1983 | Freller et al. | 204/192 P |
| 4,421,622 A | 12/1983 | Hollars | 204/192 P |
| 4,623,601 A | 11/1986 | Lewis et al. | 430/69 |
| 5,135,581 A | 8/1992 | Tran et al. | 136/256 |
| 5,181,141 A * | 1/1993 | Sato et al. | 359/580 |
| 5,397,920 A | 3/1995 | Tran | 257/749 |
| 5,407,733 A | 4/1995 | Bjornard et al. | 428/216 |
| 5,579,162 A * | 11/1996 | Bjornard et al. | 359/580 |
| 5,783,049 A | 7/1998 | Bright et al. | 204/192.14 |
| 6,111,698 A | 8/2000 | Woodard et al. | 359/585 |
| 6,144,479 A | 11/2000 | Lugg et al. | 359/267 |

* cited by examiner

Primary Examiner—Nam Nguyen
Assistant Examiner—Steven H. VerSteeg
(74) Attorney, Agent, or Firm—Law Offices of Terry McHugh

(57) ABSTRACT

A multi-layer antireflection coating is formed to include successive layers of a medium refractive index material, a high refractive index material, and a low refractive index material. The medium refractive index layer is hydrogenated in order to tailor the refractive index of the material to below 1.99 and to increase clarity in transmission. Preferably, the hydrogen atomic concentration is at least 7 percent, more preferably exceeds 9 percent, and most preferably exceeds 18 percent. The three layers combine to form a three-layer antireflection coating, but the hydrogenation may be used in antireflection coatings having a greater or lesser number of layers.

18 Claims, 11 Drawing Sheets

HYDROGENATING A LAYER OF AN ANTIREFLECTION COATING

TECHNICAL FIELD

The invention relates generally to providing desired optical properties at a surface of a light transmissive member, and relates more particularly to providing an antireflection coating onto the surface of a substrate, such as a display screen.

BACKGROUND ART

Coatings are applied to light transmissive members in order to impart desired optical properties to the members. For example, one or more coatings may be applied to a screen of a computer monitor in order to provide polarization or to reduce reflection. One method for reducing light reflection from a substrate, such as a cathode ray tube (CRT), is to coat the surface with an antireflection layer having a thickness of approximately one-quarter wavelength of the light spectrum of interest. The antireflection layer may be an organic material, such as a polymer, or an inorganic material, such as a metal fluoride, where the deposited layer has a refractive index that is less than that of the CRT. A high reduction in reflection is achieved when the refractive index of the deposited antireflection layer generally equals the square root of the refractive index of the CRT material. This approach has limitations. Single layer, low refractive index antireflection coatings often exhibit distinct colorations. In addition, easily sputtered materials with suitably low indices are not readily available.

Antireflection coatings having wider reflection suppression bandwidths, and consequently less coloration in reflection, may be obtained by using multiple deposited layers. Three common antireflection coating designs are the quarter/quarter (Q/Q), the quarter/half/quarter (Q/H/Q), and the quarter/quarter/quarter (Q/Q/Q) stacks. That is, the antireflection coating is formed of a number of layers having selected refractive indices, with the layers being approximately equal in optical thickness to one-quarter (Q) or one-half (H) of a wavelength of interest. Typically, the wavelength is in the visible spectrum of light (e.g., 550 nm).

In order to provide an efficient antireflection coating, the refractive indices of the particular layers must be considered. One well known approach is to alternate between a layer having a high refractive index and a layer having a low refractive index. An alternative approach is to provide a three-layer stack in which the layer closest to the substrate has a refractive index that is below the refractive index of the center layer, but greater than the refractive index of the outermost layer (i.e., Q/Q/Q: medium/high/low). One concern with either of these approaches is that the antireflection performance (i.e., reflection amplitude and bandwidth) is dependent upon achieving the desired refractive indices for the individual layers. For example, in the three-layer stack, the medium refractive index of the first layer may be difficult to properly tailor when using conventional materials. A second concern is that when readily sputtered materials such as indium oxide, zinc oxide or tin oxide are incorporated into the antireflection coatings, the coatings are not clear in transmission throughout the visible light spectrum.

In the three-layer stack, the selection of high index materials that meet the design goals of the center layer are somewhat limited. Titanium oxide ($TiO_2$) is the most common high index material. This material has a refractive index in the range of 2.3 to 2.6. However, from a practical stand-point, as a result of the higher attainable deposition rate, niobium oxide ($Nb_2O_5$) is often preferred, despite its refractive index being in the range of only 2.2 to 2.4. Generally, the low index material of the outermost layer is a sputtered silicon oxide ($SiO_2$). This is primarily due to the ease with which silicon oxide is deposited using AC powered cathodes. The most common and easily sputtered medium index materials are zinc oxide (ZnO), indium oxide (InO) and tin oxide (SnO). When sputter deposited, these oxides tend to have a slightly higher refractive index than desired. Moreover, the resulting optical stack tends to be yellow in transmission.

What is needed is a method of fabricating a relatively inexpensive antireflection coating that has a wide reflection suppression bandwidth and is clear in transmission. What is further needed is such an antireflection coating that is relatively easy to manufacture.

SUMMARY OF THE INVENTION

A multi-layer antireflection coating is formed to include a sequence of a medium refractive index layer, a high refractive index layer, and a low refractive index layer, with the medium refractive index layer being hydrogenated in order to reduce its refractive index to below 1.99. Preferably, the hydrogen concentration (atomic concentration) within the medium refractive index layer is at least 7 percent. More preferably, the hydrogen concentration exceeds 9 percent, and most preferably 18 percent. Of the three layers, the medium refractive index layer is closest to the substrate for which antireflection is achieved. Preferably, this layer is formed of an indium, tin or zinc oxide or an oxide of an alloy in which indium, tin or zinc is a major constituent (i.e., greater than 50 percent by weight). The hydrogen is introduced to the material to achieve two advantages. Firstly, the hydrogen reduces the refractive index of the layer, thereby improving the reflection suppression bandwidth of the antireflection coating. Secondly, introducing the hydrogen into the medium index layer causes this layer to be clearer in transmission. That is, a yellow-looking coating is less likely to result.

The invention is primarily focused on an antireflection coating that consists of only three layers, although hardcoat layers, adhesion layers and lubricating layers can be added to the antireflection coating. The preferred low index layer is silicon oxide, which has a refractive index of 1.44 to 1.51. The preferred materials for the high index layer are titanium oxide or niobium oxide. Most preferably, the material is niobium oxide ($Nb_2O_5$), since it has a higher deposition rate. The index of $Nb_2O_5$ is in the range of 2.2 to 2.4. Regarding the medium index layer, it has been discovered that by adding the hydrogen when sputtering one of the preferred materials, the oxides become very clear in transmission and the refractive index is reduced to a more desirable range. Specifically, depending upon how much hydrogen is added, the refractive indices of the hydrogenated preferred materials are reduced from the range of 2.05 to 2.1 to the range of 1.85 to 1.95. The preferred index for the medium index layer is 1.85 to 1.98. More preferably, the index of the medium index layer is in the range of 1.90 to 1.95.

Although the hydrogen-modified oxide coatings are preferably used to provide advantages in the three-layer antireflection stack, the invention may be used in other antireflection coatings. That is, the hydrogenation of one or more layers to tailor the refractive index and/or to achieve desired clarity may be utilized in other approaches to fabricating an antireflection coating.

An advantage of the invention is that the antireflection coating is readily sputtered. AC or DC sputtering may be utilized. Moreover, the sputtering may be carried out using fully oxidized reactive sputtering or using transition mode techniques. The transition mode provides rate enhancement by utilizing computer-controlled sputtering in which the reactive gas availability relative to the availability of the sputtered metal atom is carefully controlled. The monitoring of the availabilities may be achieved by means of monitoring the plasma emission, the plasma impedance, or the oxygen partial pressure. The control of the relative availabilities may be achieved by controlling the reactive gas flow of the system or by controlling the power to the target. The target may be metal or ceramic.

DETAILED DESCRIPTION

Figure 1:
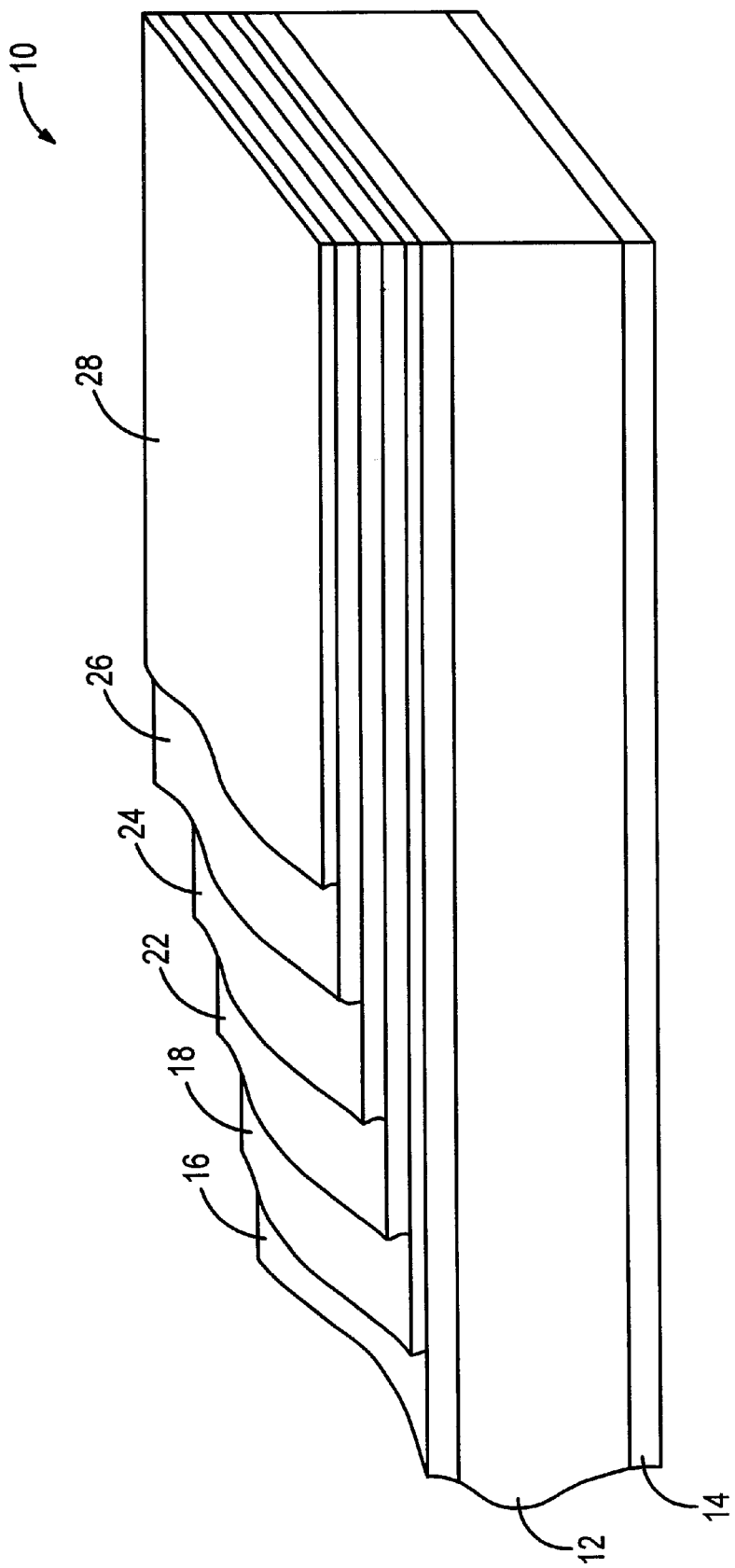
FIG. 1 is a perspective view of one embodiment of an optical member having a hydrogen-modified antireflection coating in accordance with the invention.
Figure 2:
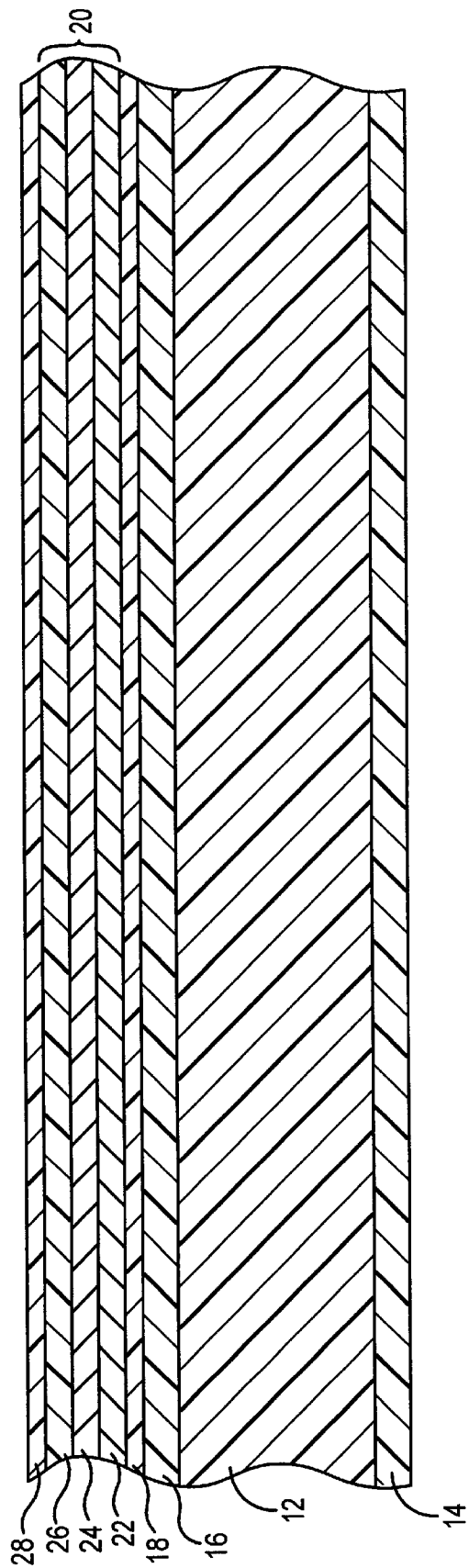
FIG. 2 is a side sectional view of the hydrogen-modified antireflection coating of FIG. 1.

With reference to FIGS. 1 and 2, one embodiment of an optical member 10 which incorporates an antireflection coating in accordance with the invention is shown as including a light transmissive substrate 12. The substrate may be a flexible material such as polyethylene terephthalate (PET), but other substrate materials may be used. The invention is used to limit light reflection or absorption prior to the light propagating into the substrate 12. In the absence of the antireflection coating to be described below, the substrate may exhibit a relatively high reflection level. For example, PET reflects from 10 percent to 15 percent of visible light (two-sided reflection). The hydrogen-modified antireflection coating is designed to significantly reduce the reflection level on one side of the substrate. Optionally, the antireflection coating may be applied to both sides.

If the substrate 12 is formed of a flexible material, the optical member 10 may be applied to another substrate, such as a CRT screen. On the other hand, the antireflection coating 20 can be applied directly to the final product. Thus, the substrate material may be organic or inorganic.

Optionally, the optical member 10 includes hardcoat layers 14 and 16 on at least one side (typically only on the front side) of the substrate 12. The hardcoat layers improve the durability of the flexible substrate during processing and during use of the end product. Hardcoat layers are known in the art. Acceptable materials for forming such layers include silica-based hardcoats, siloxane hardcoats, melamine hardcoats, acrylic hardcoats and the like. Such materials typically have refractive indices of 1.4 to 1.6. Preferably, the hardcoat layers and the substrate have approximately equal refractive indices. An acceptable thickness range for the hardcoat layer is 1 μm to 20 μm.

Atop the upper hardcoat layer 16 is a thin primer layer 18 that promotes adhesion of the antireflection coating to the hardcoat layer 16. The primer layer may be a metal or semiconductor that undergoes conversion (i.e., oxidation) after deposition, so as to yield a substantially transparent, substantially colorless inorganic material. Examples of useful primer materials include silicon, titanium, chromium and nickel. Alternatively, the primer layer may be deposited as a substoichiometric oxide, such as $CrO_x$, $SiO_x$ and the like. The primer layer 18 should be sufficiently thin to minimize disruption of the desired optical properties of the optical member 10. Preferably, the primer layer has a thickness of less than 50 Angstroms.

In the preferred embodiment, the invention is a three-layer antireflection coating. However, the advantages provided by the invention may be realized in other multi-layer antireflection coatings. In FIGS. 1 and 2, the antireflection coating 20 is formed by a lower layer 22 having a medium refractive index, a center layer 24 having a high refractive index, and an upper layer 26 having a low refractive index. The preferred materials for the high index layer 24 are $TiO_2$ and $Nb_2O_5$. A $TiO_2$ layer has a higher index than the $Nb_2O_5$ (i.e., n=2.3 to 2.6, as compared to n=2.2 to 2.4), but $Nb_2O_5$ can be sputter deposited at a higher deposition rate. The preferred material for the upper layer 26 is $SiO_2$, which has an index in the range of 1.44 to 1.51.

The most challenging layer in the antireflection coating 20 is the medium index layer 22 at the bottom of the coating. It is desired that the medium index layer (as well as the high index layer 24 and the low index layer 26) be clear in transmission. That is, the layer should be non-absorbing. The composition of the layer and the means of depositing the medium index layer are the focus of the invention.

The most common, inexpensive and readily sputtered materials for forming a desirable medium index layer 22 are indium oxide, tin oxide and zinc oxide. However, when sputter deposited, these oxides have a slightly higher refractive index than optimal and are yellow in transmission. Nevertheless, it has been found that by intentionally introducing hydrogen during the sputtering process, these oxides become very clear in transmission and the refractive index is lowered to an acceptable range. The refractive index of the hydrogenated oxide is preferably less than 1.99 and more preferably less than 1.96.

The addition of the hydrogen is effective both for fully oxidized (non-conductive) oxides and substoichiometric (conductive) oxides. That is, the hydrogen modification is effective for transparent conductors, such as indium tin oxide (ITO). Rather than simple indium, tin or zinc oxides, various alloys may be used to form the medium index layer 22, provided indium, tin and/or zinc is a major constituent of the alloy. It should be further noted that since indium, tin and zinc are readily sputtered, the deposition of these layers transfers a non-destructive level of heat to the substrate 12.

As a consequence, these materials are particularly compatible with use of heat-sensitive plastic substrates.

The hydrogen concentration within the medium index layer 22 is preferably at least 7 percent, more preferably exceeds 9 percent, and most preferably exceeds 18 percent. The measurement of the hydrogen concentration should be at or above these levels when hydrogen forward scattering (HFS) techniques are used to determine the hydrogen content. HFS is a process that is available in the art. It is a subset of the Rutherford Back Scattering (RBS) approach. Briefly, the HFS technique includes placing a detector at an angle (30°) from the forward trajectory of a helium ion beam, and rotating the sample being analyzed so that the incident beam strikes the surface at 75° from the normal. It is then possible to collect light atoms, namely hydrogen, which are forward scattered from the sample after collision with the probing $He^{++}$ ion beam. Results can then be compared to previously acquired reference results in order to calculate the atomic concentration of hydrogen.

The absorption of visible light exhibited by the medium index layer 22 should be as low as practically obtainable. For the isolated layer having a thickness of 120 nm, an indium oxide layer preferably has an absorption of less than 15 percent and more preferably less than 10 percent. A comparable layer of zinc oxide should have an absorption of less than 10 percent, while a tin oxide layer having a thickness of 120 nm should have an absorption of 5 percent. All of these absorption levels are specific to light having a wavelength of 400 nm.

A wide range of layer thicknesses may be used in the preferred three layers 22, 24 and 26 of the antireflection coating 20. Examples of acceptable thicknesses are shown in Table 1.

TABLE 1

| Lower Layer ITO (n = 1.93) | Center Layer $Nb_2O_5$ (n = 2.21) | Combined Thicknesses ITO + $Nb_2O_5$ | Upper Layer $SiO_2$ (n = 1.48) |
| --- | --- | --- | --- |
| 50 nm (0.18) | 80 nm (0.32) | (0.50) | 85.0 nm (0.23) |
| 60 nm (0.21) | 70 nm (0.28) | (0.49) | 89.0 nm (0.24) |
| 70 nm (0.25) | 55 nm (0.22) | (0.47) | 92.5 nm (0.25) |
| 80 nm (0.28) | 45 nm (0.18) | (0.46) | 96.0 nm (0.26) |

Optical thicknesses are indicated in terms of the wavelength 550 nm and are shown in parentheses. The sums of the optical thicknesses of the first two layers 22 and 24 are given in the third column. It can be seen that the antireflection coating 20 is a derivation of the antireflection approach of quarter-wavelength medium index/quarter-wavelength high index/quarter-wavelength low index. However, it should also be noted that in order to maintain an optimally tuned coating 20, the total optical thickness of the first two layers 22 and 24 should be approximately one-half wavelength.

Optionally, the optical member 10 includes a lubricating layer 28 of a fluorocarbon with a low surface energy and with anti-friction properties to facilitate cleaning and scratch resistance. An acceptable material for the lubricating layer is sold by 3M Company under the federally registered trademark FLUORORAD. The most preferred material is FLUORORAD FC-722, which is sold diluted by a 2 percent solution in a fluorinated solvent.

The process for forming the optical member 10 of FIGS. 1 and 2 will be described with reference to FIG. 3. In a first step 30, the substrate is provided. As previously noted, the substrate may be a flexible material, such as a continuous web of PET. Typically, PET substrates include the hardcoat layers 14 and 16 on at least one side. The substrate alternatively may be a rigid material.

The primer layer 18 is then added to the substrate 12 at step 32. The use of the primer layer is not critical to the invention. Typically, the primer layer is formed following a mild preglow treatment of the surface area of the hardcoated substrate on which the primer layer material is formed. The preglow is an ionized gas cleaning that conditions the surface to improve adhesion for the subsequently deposited layer. The preglow and the primer. layer deposition may occur simultaneously in an initial pass of a web of hardcoated substrate material through a sputter deposition apparatus. In sputtering, a voltage is applied to a metal, a semiconductor, or a metal compound sputtering cathode in the presence of a reactive or non-reactive gas in order to create a plasma. The action of the sputtering gas plasma on the cathode causes atoms of the cathode target to be dislodged and to travel for deposition onto the substrate positioned adjacent to the sputtering source. Typically, the sputtering gas is a noble gas, such as krypton, argon or the like. Argon is the most common sputtering gas because of its attractive cost. It is also known in the art to employ 1 percent to 90 percent of one or more reactive gases as compounds of a sputtering gas mixture. When a reactive gas is present, it causes a metal or semiconductor to be deposited as an oxide (when an oxygen source is present), an oxynitride (when an oxygen source and a nitrogen source are present), or another material that is dependent upon the presence of an appropriate gas. With regard to the present invention, a hydrogen source is utilized in the step 34 of sputter depositing the medium index layer 22. Two common hydrogen sources are hydrogen gas and water.

Each of the steps 34, 36 and 38 of sputter depositing one of the layers 22, 24 and 26 of the antireflection coating 20 may be implemented using either AC sputtering or DC sputtering. Moreover, the process may employ either fully oxidized reactive sputtering or transition mode sputtering. In the transition mode (i.e., rate enhancement), the sputtering process is computer controlled, with the reactive gas availability relative to the sputter metal atom availability being carefully monitored and controlled. The monitoring process may be executed by detecting the plasma impedance, the plasma emission or the oxygen partial pressure. The relative availabilities can be controlled by either adjusting the reactive gas flow or the power to the target to offset detected changes in the process. As another alternative, the target may be metal or ceramic (e.g., indium tin oxide).

Figure 4:
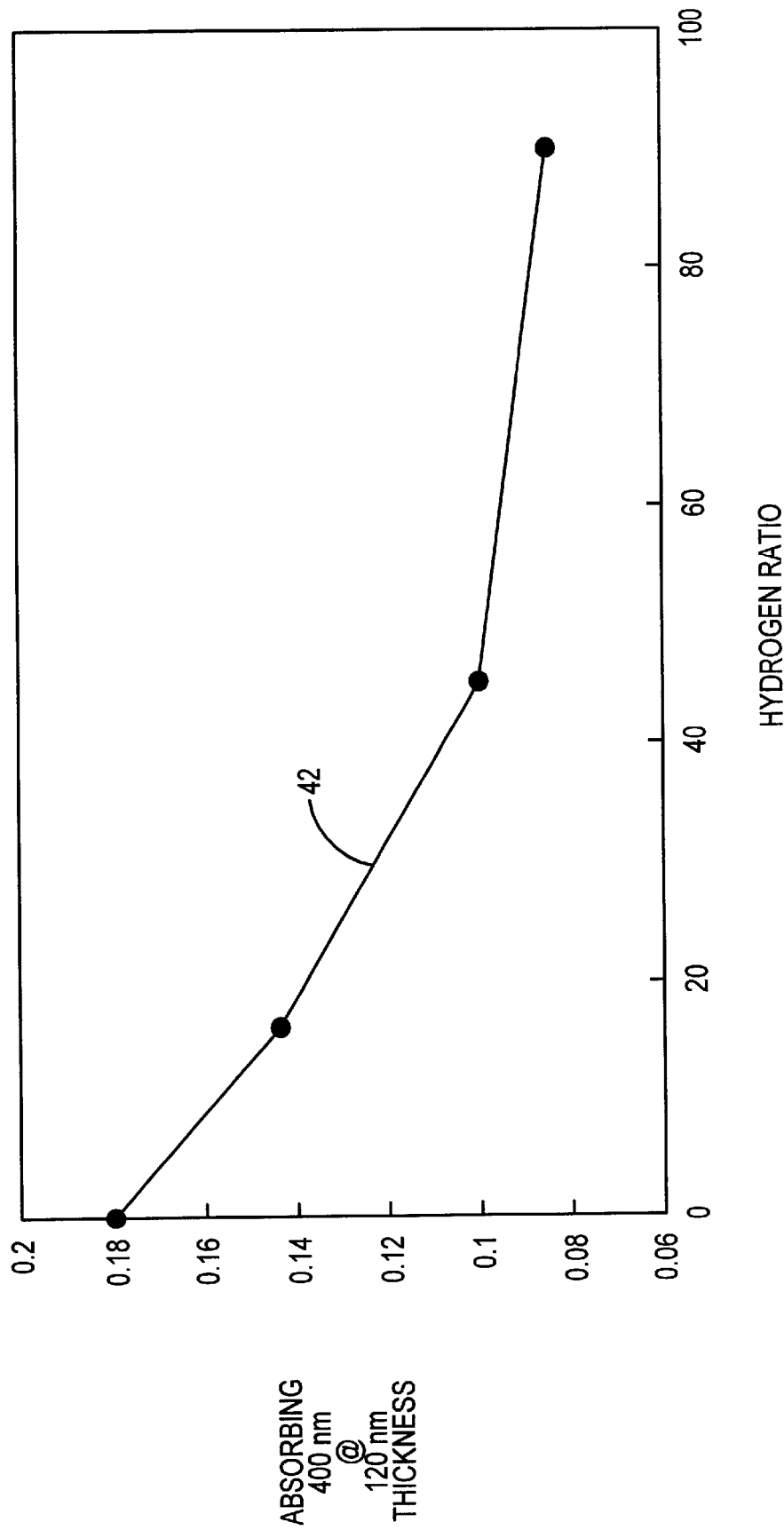
FIG. 4 is a plot of variations in the absorption of 400 nm light as a result of changes in the hydrogen ratio used during reactively sputtering a medium refractive index layer in the antireflection coating of FIGS. 1 and 2.

The medium index layer 22 is formed at step 34 in a hydrogen environment. Preferably, the deposited medium index layer has a hydrogen concentration of at least 7 percent, and more preferably the hydrogen concentration exceeds 9 percent. In the most preferred embodiment, the hydrogen concentration exceeds 18 percent. The benefits of a hydrogenated medium index layer can be recognized by referring to Table 2 and FIGS. 4, 5 and 6. The table and the graphs of FIGS. 4–6 were obtained for four samples that were fabricated using different hydrogen ratios. The hydrogen ratio is the ratio of hydrogen flow to oxygen flow during the sputtering process (i.e., $H_2$ flow/$O_2$ flow). The sputtering process utilized fully oxidized reactive DC sputtering to form a layer of $In_2O_3$. The target (metal) was powered at 5.5 kW. The nitrogen flow was 7.5 standard centimeters per minute (sccm). All flow rates identified in Table 2 are in units of sccm. The argon flow rate was set at 15.5 sccm to obtain 3 microns of pressure. The measure of the hydrogen atomic concentration (i.e., "hydrogen concentration") were obtained using the HFS techniques described above. Charles Evans and Associates in Redwood City, Calif. performed the analytical process.

nesses of the layers used in the stack were: indium oxide (55.5 nm)/niobium oxide (64.7 nm)/silicon oxide (89 nm). Details of each vacuum deposition pass are given below.

TABLE 2

| Sample Number | $H_2$ Ratio | Line Speed (mm/sec) | $O_2$ Flow | $H_2$ Flow | Refractive Index | Deposited Thickness | Absorption @ 400 nm | $H_2$ Atomic Concentration |
|---|---|---|---|---|---|---|---|---|
| 4 | 0 | 2.7 | 55.2 | 0 | 2.08 | 119 | 0.1778 | 4 |
| 3 | 15 | 3.0 | 56.8 | 8.5 | 2.02 | 124 | 0.1427 | 30 |
| 2 | 45 | 3.0 | 55.0 | 24.8 | 1.96 | 142 | 0.0989 | 33 |
| 1 | 90 | 3.0 | 52.2 | 46.9 | 1.92 | 122 | 0.0826 | 41 |

Figure 5:
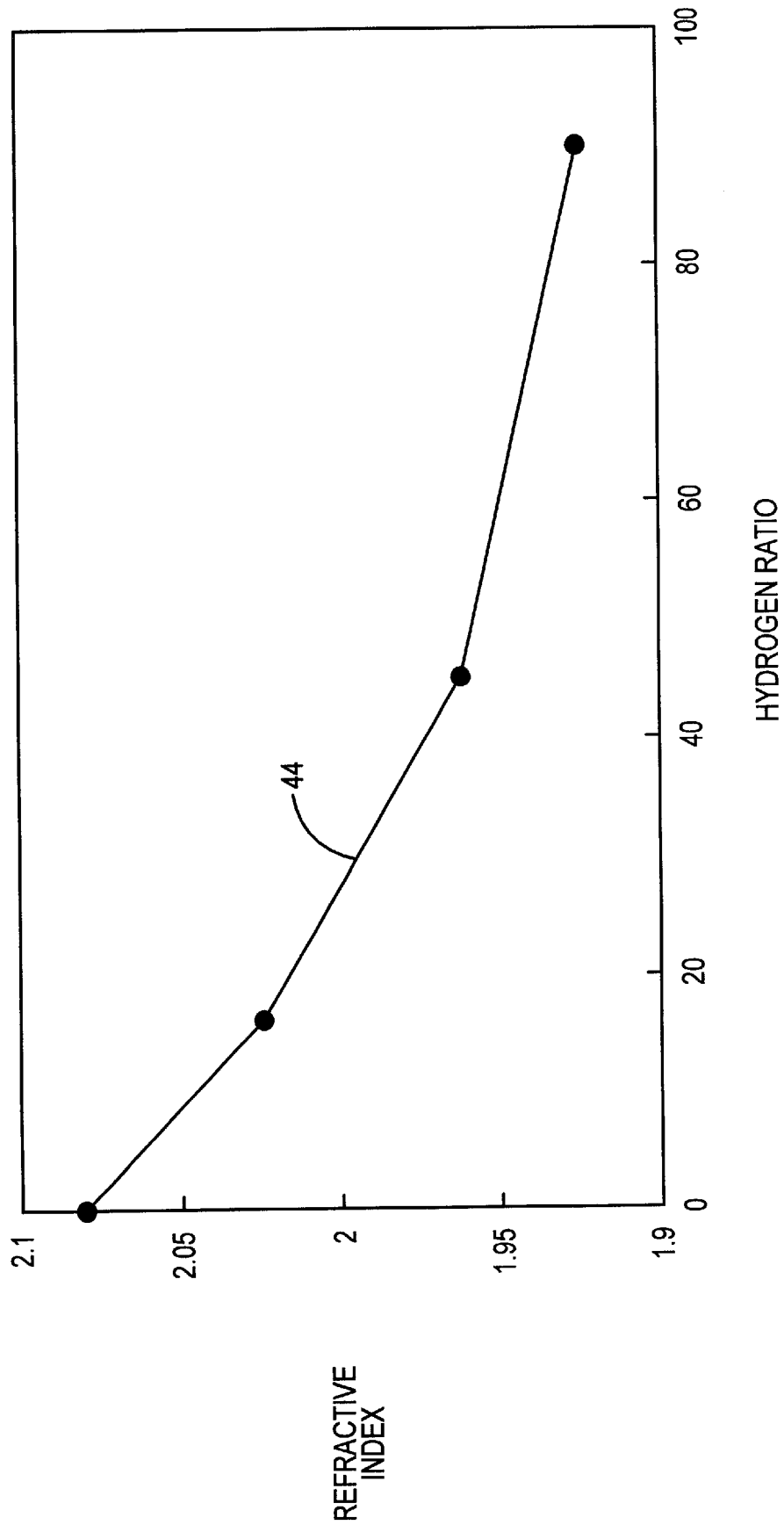
FIG. 5 is a plot of the changes in refractive index as a result of the same changes in hydrogen ratio as FIG. 4.
Figure 6:
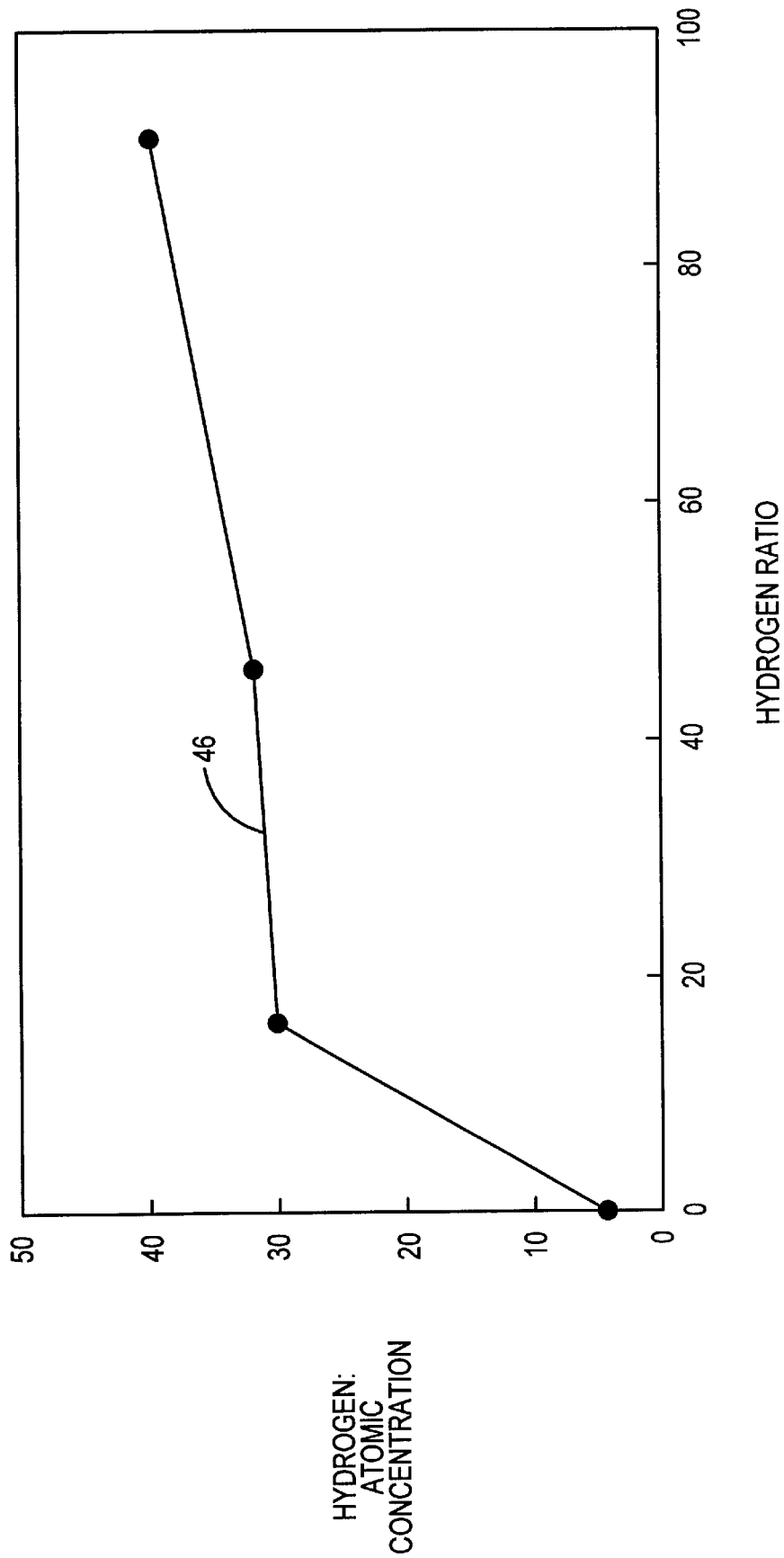
FIG. 6 is a plot of variations in the hydrogen atomic concentration as a result of the same variations of hydrogen ratio as FIGS. 4 and 5.

As can be seen in Table 2, the hydrogen ratio was varied significantly in forming the four samples. However, the oxygen flow remained relatively stable within the range of 52.2 sccm to 56.8 sccm. Absorption at a wavelength of 400 nm is plotted 42 in FIG. 4. It can be seen that the absorption reduces significantly as a result of the introduction of hydrogen. Referring now to FIG. 5, the plot 44 shows the relationship between refractive index and introducing hydrogen into the $In_2O_3$ layer. Greater reductions in absorption and refractive index are possible with a tin oxide layer, since such a layer has a lower inherent absorption in the visible light spectrum. FIG. 6 is a plot 46 of the effect of changes in the hydrogen ratio on the hydrogen atomic concentration of the $In_2O_3$.

Figure 3:
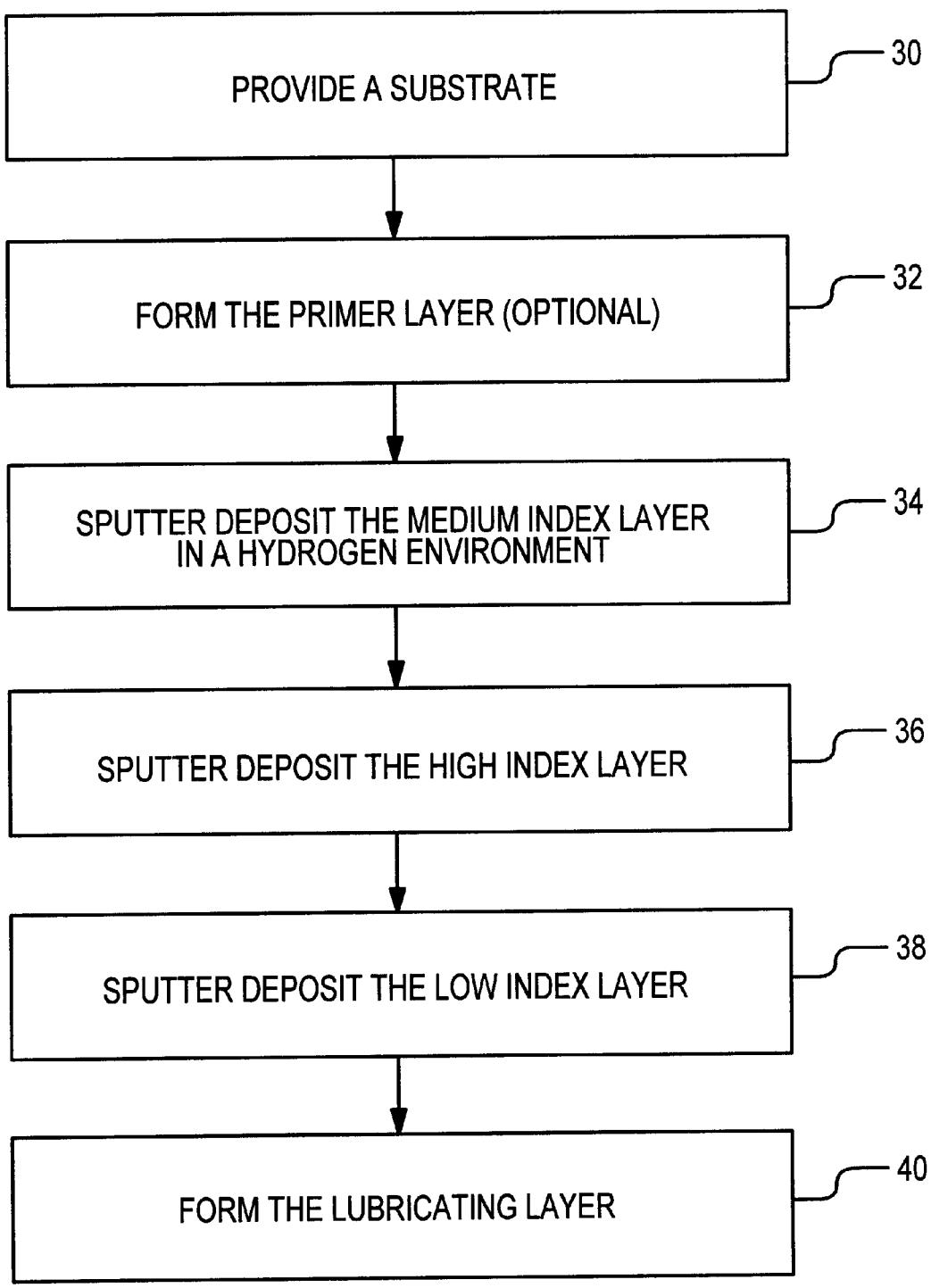
FIG. 3 is a process flow of steps for fabricating the hydrogen-modified antireflection coating of FIGS. 1 and 2.

Referring to the process flow of FIG. 3, after the medium index layer has been formed at step 34, the high index layer is sputter deposited at step 36. Conventional techniques may be utilized. As already noted, the use of $TiO_2$ carries benefits with regard to performance, but the use of $Nb_2O_5$ has practical advantages, since it can be formed at a higher deposition rate. The combined thickness of the medium in high index layers 22 and 24 of FIG. 1 should be approximately one-half of the wavelength of interest, such as 550 nm.

In step 38, the low index layer 26 is sputter deposited. Conventional techniques may be utilized. Generally, the third layer is formed of $SiO_2$. However, other materials having appropriate properties may be substituted. The lubricating layer 28 is then applied at step 40.

EXAMPLES

In order to determine the benefits of the hydrogen-modified antireflection coating, two additional samples were fabricated, with and without hydrogen within the medium index layer 22. Each sample included sputtering indium oxide for the medium index layer. The optical member included a 7 mil (1.75 micron) PET substrate with an acrylic hardcoat, a silicon primer layer, an indium oxide layer (or preferably a hydrogenated indium oxide layer), a niobium oxide layer, and a silicon oxide layer. The samples were prepared in a laboratory web-sputtered coater. To simplify the process, each layer was deposited in a separate pass through the web coater. To determine in situ the characteristics of the coating, an optical spectrophotometer was installed inside the web coater. The spectro-photometer measured reflection and transmission spectra over the ultraviolet, visible and near infrared portions of the spectra (i.e., reflection and transmission at wavelengths from 360 nm to 2100 nm).

Sample 1

No Hydrogen

The unique feature of SAMPLE 1 is that it was deposited using indium oxide with no added hydrogen. The thick- Pass 1: Glow and Prime During this pass, the hardcoated side of the substrate was glowed and primed. The web was moved through the coating zone at a line speed of 25 mm/sec. Oxygen was introduced into the preglow at a flow of 14.5 sccm to provide a pressure of 3.2 milliTorr. The aluminum glow rod was powered at 1500 volts with a current of 100 mA.

The silicon primer was applied using an AC powered cathode pair. An argon gas flow of 94.0 sccm was introduced into the sputtering chamber to obtain a pressure of 3.2 milliTorr. The silicon primer was powered as required to drop the substrate transmission at a wavelength of 400 nm by 1.5 percentage points. More specifically, the silicon was powered at 0.81 kW.

Pass 2: Indium Oxide

The indium oxide was DC sputtered at a pressure 0.5 microns above cascade. (Here the cascade point is defined as the pressure at which the target switches from fully oxidized to metallic when oxygen gas is manually introduced at various fixed flows.) Sputtering with a gross excess of oxygen as is described here is referred to as the "fully oxidized" mode.

During the deposition of the indium oxide layer, the amount of oxygen introduced was controlled by a plasma emission monitor (i.e., PEM) set at a wavelength of 450 nm. Note in the example discussed here that the indium oxide was not deposited in the high rate transition mode as is generally the case for PEM-controlled processes.

The amount of indium oxide to be deposited was determined by finding the line speed required to obtain a coating with a reflection minimum at a wavelength of 478 nm. Then the line speed was doubled to produce the desired layer thickness. Thus, initially the indium oxide was deposited at a line speed required to achieve twice the thickness actually needed in the antireflection coating. This was done because the reflection minimum wavelength of the 2X thick coating is readily measured with the in situ optical monitor. In this pass, the final line speed was 4.77 mm/sec.

Generally, the refractive index of sputtered indium oxide with no added hydrogen is ca 2.08. Thus, the 2X thick coating with a reflection minium at 478 nm corresponds to a physical thickness of 111 nm. The nominal thickness of indium oxide in the antireflection coating is thus half that, or 55.5 nm.

The metallic indium target was powered at 5.5 kW. Argon was introduced at a flow of 14.2 sccm as required to attain a pressure of 2 milliTorr when not sputtering. The oxygen flow was adjusted during the deposition to maintain a constant plasma emission; however, the flow was nominally maintained at 46.9 sccm and the total pressure was 5.9 milliTorr. No hydrogen was introduced as the indium oxide was deposited.

Pass 3: Niobium Oxide

In this pass, niobium oxide was deposited under conditions required to maintain a reflection minimum at a wavelength of 537 nm when deposited on 55.5 nm of indium oxide from Pass 2. Generally, $Nb_2O_5$ has a refractive index of 2.2 to 2.3 (at a wavelength of 550 nm) depending on sputtering conditions. In this particular run, a refractive index of ca 2.3 was obtained. Thus, from optical modeling, one determines the $Nb_2O_5$ thickness was ca 64.7 nm.

Niobium was deposited using twin AC cathodes in the high rate transition mode. In this mode, the oxygen flow is metered to the process (under computer control) as required to maintain a constant plasma emission at a wavelength of 405 nm.

Argon was introduced to the process at a flow of 95.1 sccm as required to obtain a pressure of 3 milliTorr when not sputtering. The oxygen flow was about 40 sccm with a resulting total pressure of 3.39 milliTorr.

The niobium target was powered at 5.50 kW. The web was advanced through the coater at a line speed of 7.30 to 7.25 mm/sec. Line speed adjustments were made as required to maintain the reflection minimum at 537 nm.

Pass 4: Silicon Oxide

In this pass, $SiO_2$ was deposited using a high rate transition mode process. In the transition mode process, the plasma impedance (i.e., the voltage-to-current ratio) was maintained constant by adjusting the oxygen flow. The thickness of the $SiO_2$ was determined in situ by minimizing the measured visible reflection. From optical modeling, it was determined that the physical thickness of the $SiO_2$ layer was 89 nm.

The refractive index of the $SiO_2$ depends on the operation point chosen. In this sample, the $SiO_2$ refractive index was 1.48 nm at 550 nm. This was determined by an in situ analysis of a thick $SiO_2$ layer on a non hardcoated 2 mil (50 microns) PET.

The silicon targets were powered at 5.0 kW. An argon flow of 94.7 sccm was used as required to obtain a pressure of 3 microns when not sputtering. The oxygen flow was nominally 52.8 sccm to obtain a total operating pressure of 3.29 milliTorr. The line speed was ca 8.06 mm/sec.

Sample 2

25 Sccm of Hydrogen

This stack differs from SAMPLE 1 in that 25 sccm of hydrogen was used in forming the indium oxide layer. There were also slight tuning changes to compensate for the reduced index of the indium oxide layer. The thicknesses of the layers used in this stack were: indium oxide (59.0 nm)/niobium oxide (69.2 nm)/silicon oxide (87.0 nm). Details of each vacuum deposition pass are given below.

Pass 1: Glow and Prime

During this pass, the hardcoated side of the substrate was glowed and primed just as done for SAMPLE 1. The web was moved through the coating zone at a line speed of 25 mm/sec. Oxygen was introduced into the preglow at a flow of 14.5 sccm to provide a pressure of 3.2 milliTorr. The aluminum glow rod was powered at 1500 volts with a current of 100 mA.

The silicon primer was applied using an AC powered cathode pair. An argon gas flow of 94.0 sccm was introduced into the sputtering chamber to obtain a pressure of 3.2 milliTorr. The silicon primer was powered at 0.81 kW as required to drop the substrate transmission at a wavelength of 400 nm by 1.5 percentage points.

Pass 2: Indium Oxide

The indium oxide was DC sputtered at a pressure 0.5 microns above cascade in the "fully oxidized" mode. As discussed above, the operating point was maintained by adjusting oxygen flow to obtain a constant plasma emission intensity of 450 nm.

The amount of indium oxide to be deposited was determined by finding the line speed required to obtain a reflection minimum at a wavelength of 478 nm and then doubling the line speed. In this pass, the final line speed was 7.17 mm/sec. (Note that the addition of hydrogen increased the deposition rate of indium oxide, thereby increasing the line speed of this pass by 50 percent relative to SAMPLE 1.)

The metallic indium target was powered at 5.5 kW. Argon was introduced at a flow of 14.2 sccm as required to attain a pressure of 2 milliTorr when not sputtering. As noted above, hydrogen was introduced at a constant flow of 25 sccm. The oxygen flow was nominally maintained at 57.4 sccm and the total pressure was 5.9 milliTorr. The hydrogen-to-oxygen ratio for this sample was ca 44 percent.

Generally, the refractive index of sputtered indium oxide with a hydrogen-to-oxygen ratio of about 43 percent is ca 1.96. Thus, the 2X thick coating with a reflection minimum at 478 nm corresponds to a physical thickness of 118 nm. The nominal thickness of indium oxide in the antireflection coating is thus half that, or 59.0 nm.

Pass 3: Niobium Oxide

In this pass, niobium oxide was deposited under conditions required to maintain a reflection minimum at a wavelength of 537 nm when deposited on 59.0 nm of indium oxide from Pass 2. When depositing this layer, a refractive index of ca 2.3 was obtained. Thus, from optical modeling, one determines that the $Nb_2O_5$ thickness was ca 69.2 nm. As discussed above, niobium was deposited using twin AC cathodes in the high rate transition mode.

Argon was introduced to the process at a flow of 95.1 sccm as required to obtain a pressure of 3 milliTorr when not sputtering. The oxygen flow was about 40.1 sccm with a resulting total pressure of 3.38 milliTorr. The niobium target was powered at 5.50 kW. The web was advanced through the coater at a line speed of 7.30 mm/sec.

Pass 4: Silicon Oxide

As discussed above, in this pass $SiO_2$ was deposited using a high rate transition mode process. From optical modeling, it was determined that the physical thickness of the $SiO_2$ layer was 87.0 nm. In this sample, the $SiO_2$ refractive index was determined to equal 1.48 nm at a wavelength of 550 nm.

The silicon targets were powered at 5.0 kW. An argon flow of 4.7 sccm was used as required to obtain a pressure of 3 microns when not sputtering. The oxygen flow was nominally 53.6 sccm to obtain a total operating pressure of 3.29 milliTorr. The line speed was ca 7.92 mm/sec.

RESULTS OBTAINED

Figure 7:
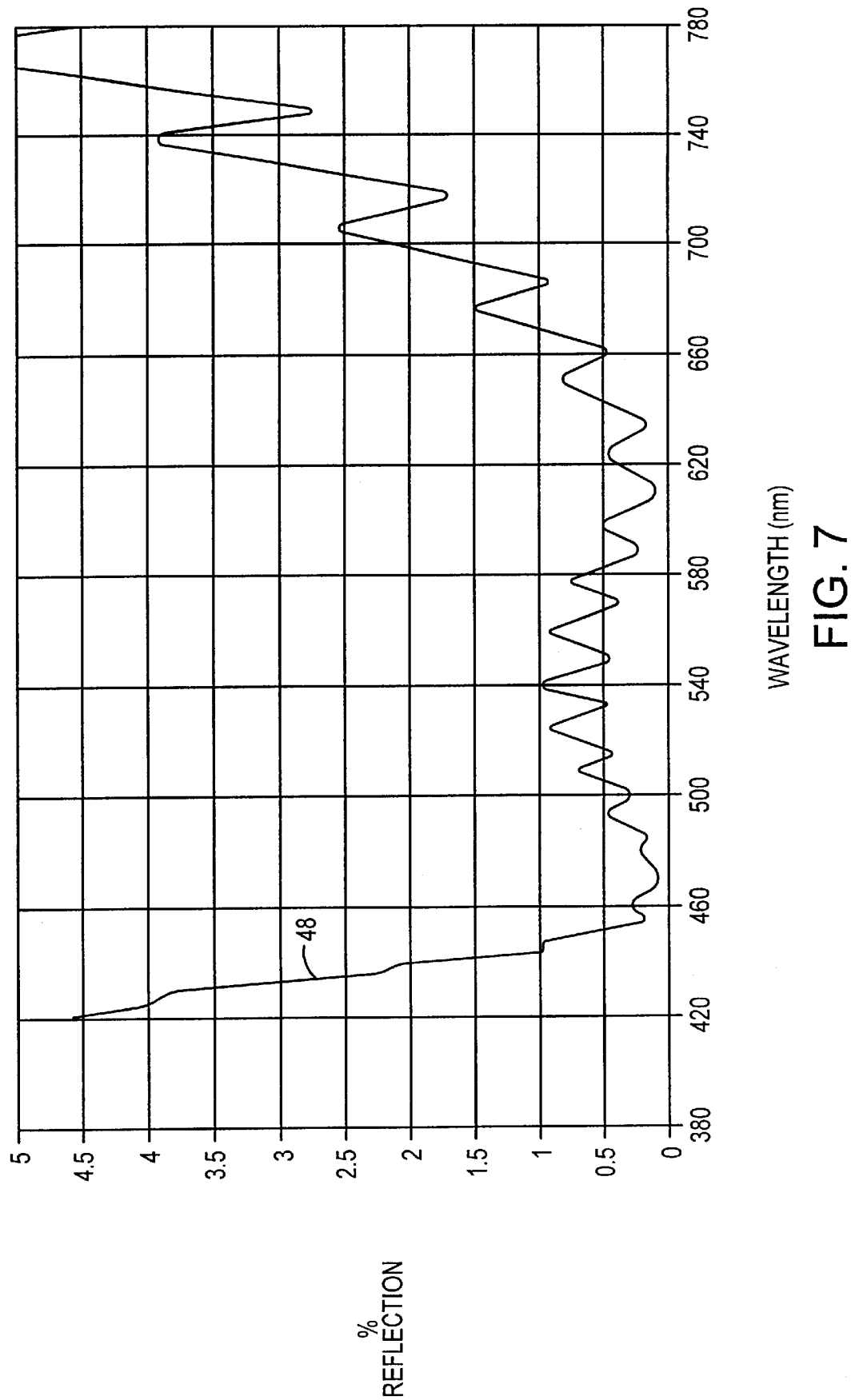
FIG. 7 is a reflection spectra for a sample that was fabricated without intentionally introducing hydrogen.
Figure 8:
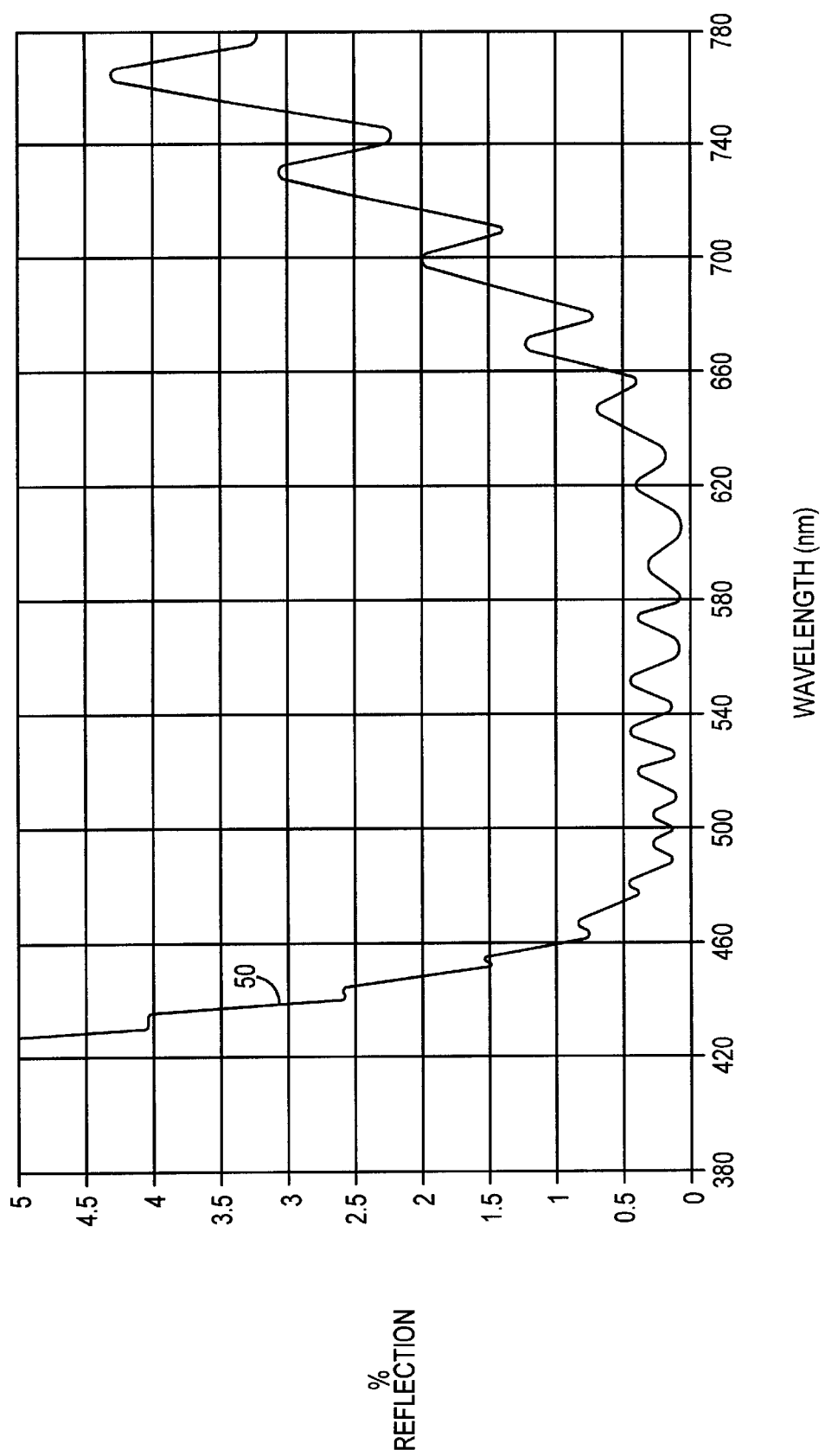
FIG. 8 is a reflection spectra for a sample that was formed to include hydrogen in a medium refractive index layer in accordance with the invention.

The reflection spectra 48 and 50 obtained for SAMPLE 1 and SAMPLE 2, respectively, are shown in FIGS. 7 and 8. In these reflection spectra, backside reflection was eliminated by applying black electrical tape to the non coated side of the substrate. In Table 3, various optical parameters are given. These include: $R_{vis}$ (the visible reflection weighted for eye sensitivity), $T_{vis}$ (the visible transmission, also weighted for eye sensitivity), and $T_{YID}$ (the transmission yellowness index).

TABLE 3

| Sample Number | $R_{vis}$ | $T_{vis}$ | $T_{YID}$ |
|---|---|---|---|
| 1 | 0.52 | 92.40 | 4.48 |
| 2 | 0.27 | 93.26 | 3.51 |

From the attached spectra and from the table presented here, clearly the preferred sample is the sample made with hydrogenated indium oxide (SAMPLE 2). The transmission yellowness index is significantly lower and the visible reflection is also less. The residual yellowness in the transmission of SAMPLE 2 is due primarily to blue reflection from the antireflection coating and residual blue absorption in the hardcoated substrate.

The two samples were subjected to various mechanical tests, including cross-hatch peel, mechanical pencil resistance, and acetone rub resistance. No difference was seen in the mechanical performance of the two samples.

ADDITIONAL EXPERIMENTATION

Additional experimentation was conducted to show effects of hydrogen on the optical properties and stoichiometry of indium oxide, zinc oxide and tin oxide. The details of deposition are provided in Table 4. The oxides were all deposited from metallic targets in the fully oxidized mode of operation. Oxygen was manually metered to the process as required to attain an operation point ca 0.5 milli-Torr above cascade.

TABLE 4

| Sample Number | 12 | 11 | 10 | 9 | 8 | 7 | 6 | 5 | 4 | 3 | 2 | 1 |
|---|---|---|---|---|---|---|---|---|---|---|---|---|
| Target Material | In | In | In | In | Zn | Zn | Zn | Zn | Sn | Sn | Sn | Sn |
| $O_2$ Flow sccm | 55.2 | 56.8 | 55.0 | 55.0 | 52.2 | 42.0 | 39.6 | 35.0 | 81.0 | 74.8 | 70.7 | 73.7 |
| $H_2$ Flow sccm | 0.0 | 8.5 | 24.8 | 46.9 | 0.0 | 6.4 | 17.9 | 31.9 | 0.0 | 11.3 | 31.8 | 66.3 |
| Ar Flow sccm | 15.9 | 15.9 | 15.9 | 15.9 | 30.0 | 30.0 | 30.0 | 30.0 | 17.0 | 17.1 | 17.1 | 17.1 |
| N2 Flow sccm | 7.5 | 7.5 | 7.5 | 7.5 | 0.0 | 0.0 | 0.0 | 0.0 | 0.0 | 0.0 | 0.0 | 0.0 |
| $H_2/O_2$ Ratio | 0.00 | 0.15 | 0.45 | 0.85 | 0.00 | 0.15 | 0.45 | 0.91 | 0.0 | 0.15 | 0.45 | 0.90 |
| Pressure mTorr | 4.9 | 5.0 | 5.1 | 5.9 | 7.3 | 7.4 | 7.5 | 7.6 | 4.8 | 4.8 | 5.3 | 6.3 |
| Cathode Power kW | 5.50 | 5.50 | 5.50 | 5.50 | 4.01 | 4.01 | 4.02 | 4.02 | 5.50 | 5.50 | 5.50 | 5.50 |
| Line Speed mm/sec | 2.70 | 3.00 | 3.00 | 3.00 | 2.53 | 2.53 | 2.59 | 2.50 | 3.00 | 3.00 | 2.55 | 2.40 |
| Absorption @ 400 nm | 0.178 | 0.143 | 0.099 | 0.083 | 0.072 | 0.080 | 0.056 | 0.046 | 0.174 | 0.027 | 0.019 | 0.019 |
| Refractive Index | 2.08 | 2.02 | 1.96 | 1.92 | 2.01 | 1.96 | 1.96 | 1.93 | 2.07 | 1.95 | 1.91 | 1.89 |
| Thickness nm | 119 | 124 | 142 | 122 | 125 | 116 | 114 | 121 | 144 | 144 | 144 | 151 |
| RBS $H_2$ Atomic Concentration | 4 | 30 | 33 | 41 | 5 | 7 | 9.4 | 10 | — | — | — | — |

The optical properties were determined by analyzing transmission and reflection spectra which were measured in situ during deposition. The samples used for optical analysis were ca 120 nm thick. To determine the atomic hydrogen content, Rutherford Back Scattering Measurements (i.e., RBS) were done by Charles Evans and Associates. These were done on 400 nm thick samples deposited onto 7 mil hardcoated PET. (The thick samples were prepared to minimize measurement complications due to the substrate.)

Figure 9:
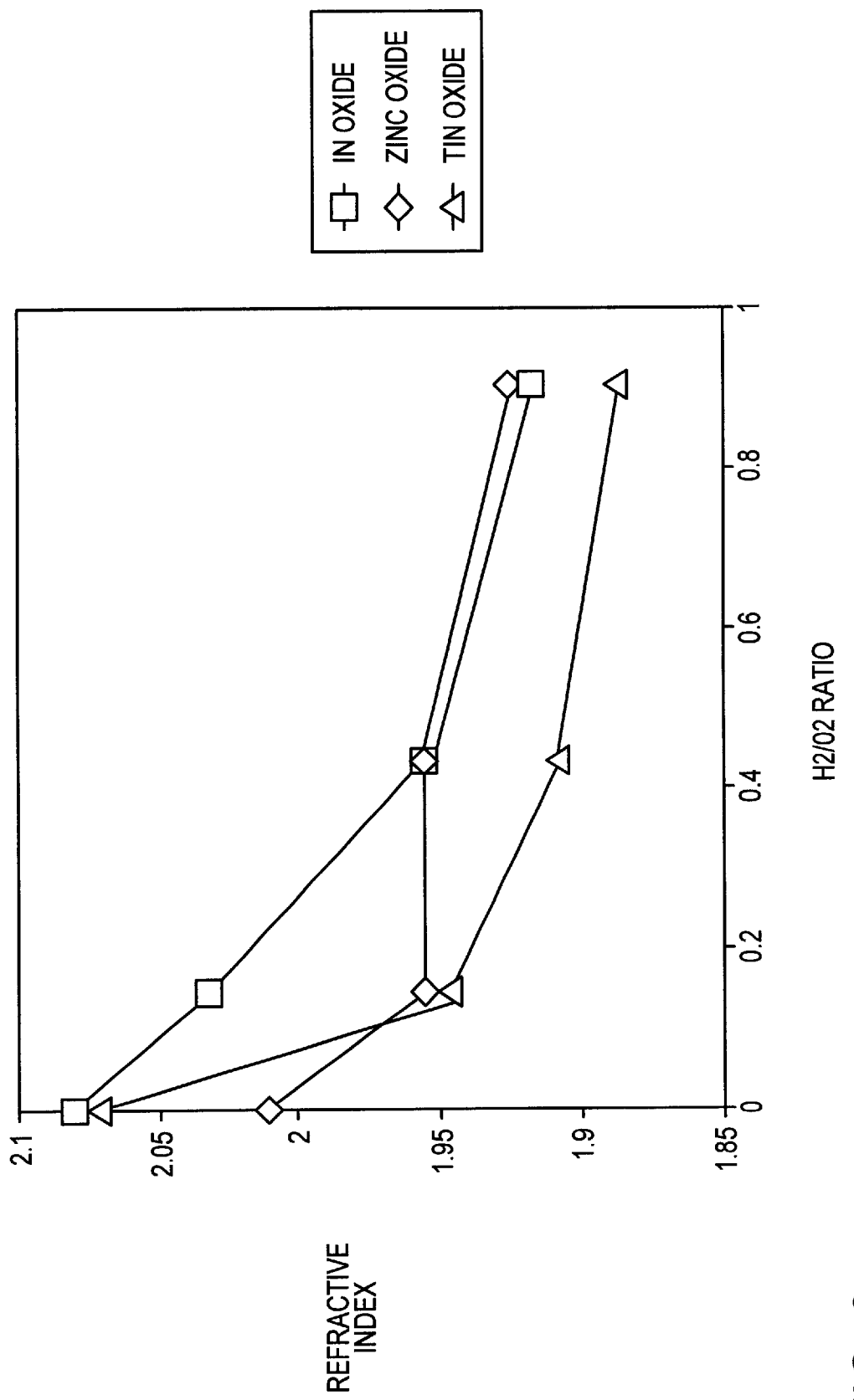
FIG. 9 shows plots of the effects of variations of the hydrogen ratio on the refractive indices of indium oxide, tin oxide and zinc oxide.

Shown in FIG. 9 are the effects of hydrogen on the refractive indices of indium, tin and zinc oxide. In all cases, the refractive indices are reduced. Thus, using hydrogen one can "fine tune" the refractive index of these oxides, thereby optimizing the performance of antireflection coatings which include these materials.

Figure 10:
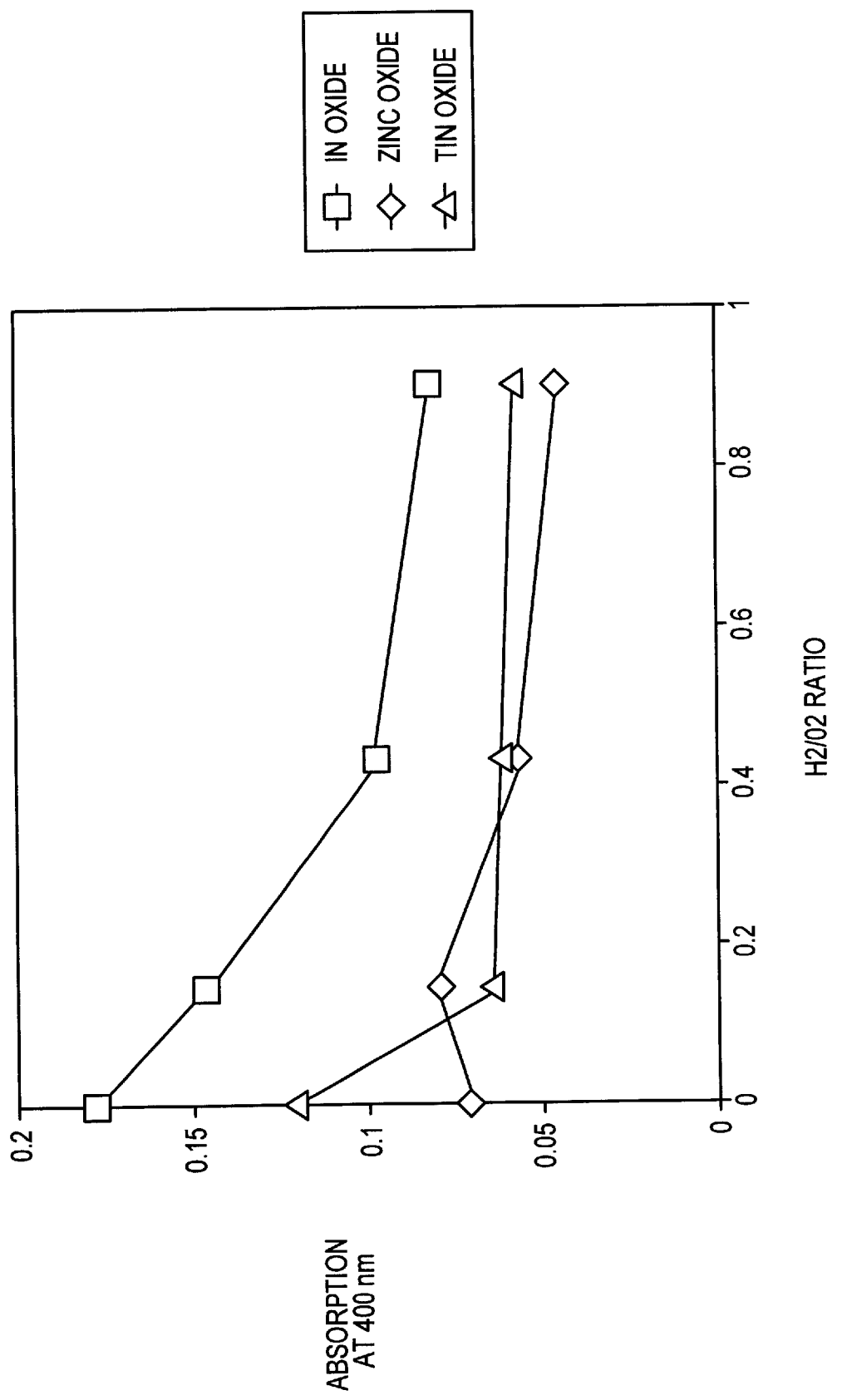
FIG. 10 shows plots of the effects of variations of the hydrogen ratio on the absorption of light having a wavelength of 400 nm.
Figure 11:
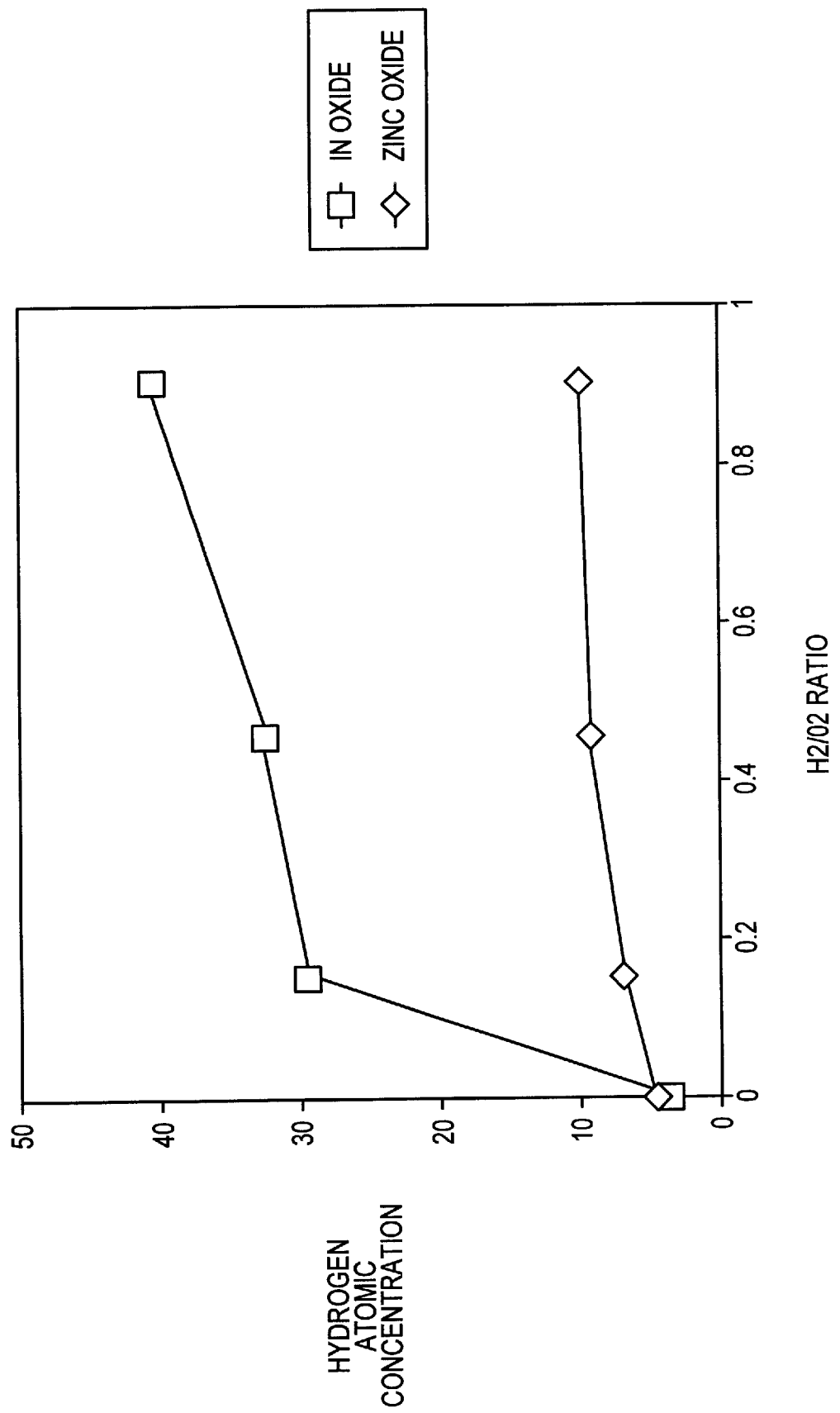
FIG. 11 shows plots of the effects of variations of the hydrogen ratio on hydrogen atomic concentration.

The effect of hydrogen on the absorption of light at 400 nm is shown in FIG. 10. In all cases, the absorption at 400 nm is reduced substantially. This reduces the yellow transmitted color of the oxides. FIG. 11 is a plot of changes in hydrogen concentration resulting from changes in the hydrogen ratio.

What is claimed is:

1. A method of forming an antireflection coating comprising the steps of:

providing a substrate having a first surface;

forming a hydrogenated first layer nearest to said first surface, including selecting said hydrogenated first layer to include a substantially transparent metal oxide having at least one of indium, tin and zinc, and further including intentionally introducing hydrogen into said metal oxide such that said hydrogenated first layer has a refractive index of less than 1.99;

forming a high refractive index second layer in contact with said hydrogenated first layer, said second layer being substantially transparent; and forming a low refractive index third layer in contact with said second layer on a side opposite to said first layer, said third layer being substantially transparent;

wherein said intentional introduction of hydrogen is implemented to reduce said refractive index of said first layer to be between refractive indices of said second and third layers.

2. The method of claim 1 wherein said step of forming said hydrogenated first layer includes introducing said hydrogen such that said hydrogenated first layer has a hydrogen content of at least 7 percent.

3. The method of claim 1 wherein said step of forming said hydrogenated first layer includes introducing said hydrogen such that said hydrogenated first layer has a hydrogen concentration of at least 9 percent.

4. The method of claim 1 wherein said forming steps fabricate said antireflection coating to consist of a three-layer stack.

5. The method of claim 1 wherein said step of forming said hydrogenated first layer includes forming said first layer to have a thickness of approximately one-quarter of a selected wavelength in the visible light spectrum.

6. The method of claim 5 wherein said steps of forming said second and third layers include providing a combined thickness of approximately one-half of said selected wavelength.

7. The method of claim 6 wherein said step of forming said second layer includes selecting one of titanium oxide and niobium oxide, said step of forming said third layer including selecting silicon oxide.

8. The method of claim 1 wherein said step of providing said substrate includes providing a substantially transparent substrate having a hardcoat layer.

9. The method of claim 1 wherein said forming steps each include using sputtering techniques.

10. A method of fabricating a three-layer antireflection stack comprising the steps of:

sputter depositing a substantially transparent first layer of material in an oxidizing and hydrogenating environment such that said first layer has a hydrogen concentration of at least 7 percent and has a first refractive index;

sputter depositing a substantially transparent second layer of material on said first layer such that said second layer has a second refractive index greater than said first refractive index; and sputter depositing a substantially transparent third layer of material on said second layer such that said third layer has a third refractive index less than said first and second refractive indices.

11. The method of claim 10 wherein said step of sputter depositing said first layer includes depositing a metal selected from the group consisting of one or more of indium, tin and zinc, thereby forming a hydrogenated and oxidized metallic layer having a refractive index of less than 1.99.

12. The method of claim 10 wherein said step of sputter depositing said first layer forms a first layer having a hydrogen concentration exceeding 18 percent.

13. The method of claim 10 wherein said steps of sputter depositing include forming said first, second and third layers on a substrate that is substantially transparent.

14. The method of claim 10 wherein said step of sputter depositing said second layer includes forming one of titanium oxide and niobium oxide and wherein said step of sputter depositing said third layer includes forming a silicon oxide.

15. A method of forming an antireflection coating comprising the steps of:

preselecting a multi-layer arrangement having a plurality of layers with a sequence of target refractive indices selected to retard reflection; and sputter depositing said multi-layer arrangement including intentionally introducing hydrogen into at least one of said layers, said at least one layer being a metal oxide layer having at least one of indium, tin and zinc, wherein said intentional introduction of hydrogen includes selecting a hydrogenated sputter environment on a basis of:

(a) tailoring a refractive index of said metal oxide layer to correspond to a target refractive index, said tailoring being a refractive index reduction; and (b) increasing a clarity of said metal oxide layer within the visible light spectrum.

16. The method of claim 15 wherein said step that includes intentionally introducing hydrogen forms said metal oxide layer to have a hydrogen concentration exceeding 7 percent.

17. The method of claim 15 wherein said step that includes intentionally introducing hydrogen forms said metal oxide layer to have a hydrogen concentration exceeding 9 percent.

18. The method of claim 15 wherein said step that includes intentionally introducing hydrogen forms said metal oxide layer to have a hydrogen concentration exceeding 18 percent.

* * * * *